(12) United States Patent
Dash et al.

(10) Patent No.: US 6,686,773 B1
(45) Date of Patent: Feb. 3, 2004

(54) REDUCING SHORT CIRCUIT POWER IN CMOS INVERTER CIRCUITS

(75) Inventors: Arup Dash, Bangalore Karnataka (IN); Sushil Kumar Gupta, Uttar Pradesh (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/207,912

(22) Filed: Jul. 31, 2002

(51) Int. Cl.$^7$ ............... H03K 19/0175; H03K 19/20
(52) U.S. Cl. ............................. 326/83; 326/121
(58) Field of Search ............... 326/83, 82, 86–87, 326/112, 119, 121–122, 26–27; 327/108–109, 379, 380, 381, 384

(56) References Cited

U.S. PATENT DOCUMENTS

| | | | | |
|---|---|---|---|---|
| 4,959,561 A | * | 9/1990 | McDermott et al. | 326/27 |
| 5,111,076 A | * | 5/1992 | Tarng | 326/27 |
| 6,097,237 A | * | 8/2000 | Singh | 327/389 |

FOREIGN PATENT DOCUMENTS

| | | | | |
|---|---|---|---|---|
| JP | 04263514 A | * | 9/1992 | H03K/19/094 |

OTHER PUBLICATIONS

K. Y. Khoo and A. N. Wilson Jr.; Entitled: "Low Power CMOS Clock Buffer"; Proc. Int. Symp. Circuits and Systems; vol. 4, 1994; pp. 355–358; (4 Pages).

Harry. J. M. Veendrick; Entitled: "Short–Circuit Dissipation of Static CMOS Circuitry and Its Impact on the Design of Buffer Circuits"; IEEE, Journal of Solid–State Circuit; Aug. 1984; pp. 468–473; (6 Pages).

H.–Y. Huang and Y.–H. Chu; Entitled: "Feedback–Controlled Split–Path CMOS Buffer"; Proc. Int. Symp. Circuits ad Systems; vol. 4, 1996; pp. 300–303; (4 Pages).

K.–H. Cheng, W.–B. Yang and H.–Y. Huang; Entitled: "The Charge—Transfer Feedback–Controlled Split–Path CMOS Buffer"; IEEE Transactions on Circuits and Systems–II: Analog and Digital Signal Processing vol. 46, No. 3, Mar. 1999; pp. 346–348; (3 Pages).

Changsik Yoo; Entitled: "A CMOS Buffer without Short–Circuit Power Consumption"; IEEE Transactions on Circuits and Systems–II: Analog and Digital Signal Processing; vol. 47 No. 9, Sep. 2000; pp. 935–937; (3 Pages).

* cited by examiner

*Primary Examiner*—James H. Cho
(74) *Attorney, Agent, or Firm*—Alan K. Stewart; W. James Brady, III; Frederick J. Telecky, Jr.

(57) ABSTRACT

A CMOS inverter circuit containing a PMOS transistor, a NMOS transistor, and feedback driver circuits not containing common input inverter circuits. The feedback driver circuits minimize (prevent) an amount of time both the NMOS and PMOS transistors are in an ON state at the same time, thereby reducing short circuit power (i.e., the power dissipated if both the PMOS and NMOS transistors are in an on state). In addition, as the two feedback driver circuits do not contain common input inverter circuits, the short circuit power is further reduced.

7 Claims, 3 Drawing Sheets

REDUCING SHORT CIRCUIT POWER IN CMOS INVERTER CIRCUITS

BACKGROUND OF THE INVENTION

The present invention relates to integrated circuits, and more specifically to a method and apparatus for reducing short circuit power consumed in CMOS inverter circuits.

DESCRIPTION OF THE DRAWINGS

The present invention will be described with reference to the accompanying drawings, wherein.

DETAILED DESCRIPTION OF THE PREFERRED EMBODIMENTS

1. Overview and Discussion of the Invention

The present invention reduces short circuit power dissipation which may occur in MOS inverters. For example, as is well known, a common input CMOS inverter generally contains a NMOS transistor and a PMOS transistor, both driven by a common input signal. When the input value changes, both the transistors may be in an ON state for a short duration of time causing current to flow to ground, and the corresponding current is referred to as short circuit current. Thus, power ("short circuit power") is dissipated when input value changes at the input of the inverter.

In an embodiment, the short circuit dissipation may be reduced (or eliminated) by using feedback drivers which do not contain transistor pair forming a common input CMOS inverter. The feedback drivers may further ensure that the PMOS transistor and NMOS transistor are not in an on status at the same time. As a result, the short circuit power dissipation may be reduced/eliminated.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Integrated Circuit

Figure 1:
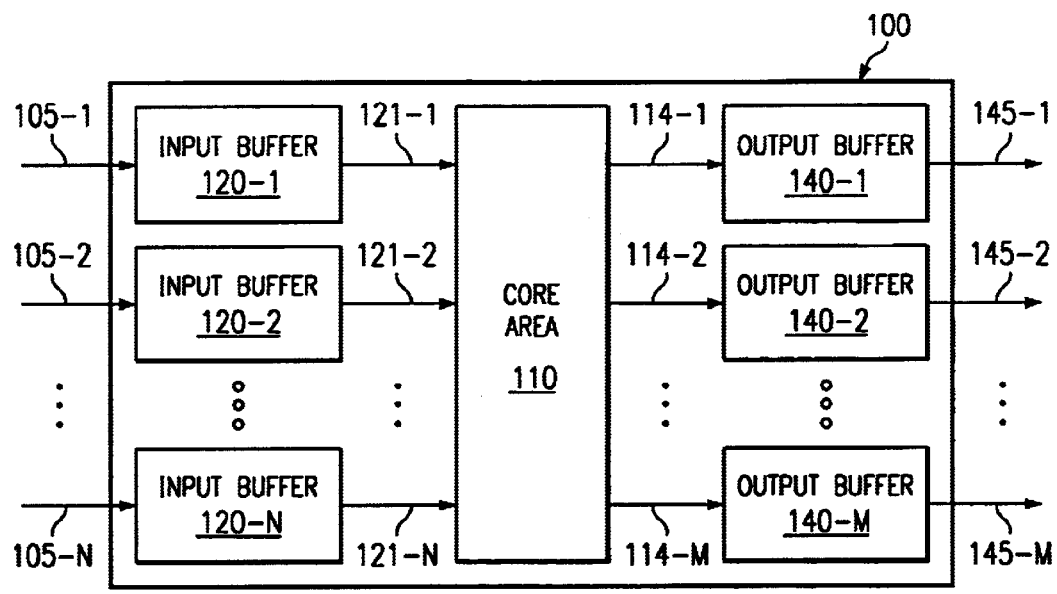
FIG. 1 is a block diagram illustrating the details of an integrated circuit in which the present invention can be implemented.

FIG. 1 is a block diagram illustrating the details of an example integrated circuit in which the present invention can be implemented. Integrated circuit 100 is shown containing core area 110, input buffers 120-1 through 120-N, and output buffers 140-1 through 140-M. Each component is described below.

Core area 110 processes input signals received on paths 121-1 through 121-N, and generates output signals on paths 114-1 through 114-M. Core area 110 may be implemented to provide any desired utility. The output signals may be used to drive other integrated circuits or any other external devices (not shown).

Input buffers 120-1 through 120-N receive input signals on paths 105-1 through 105-N and provide output on paths 121-1 through 121-N. Input buffers 120-1 through 120-N may store the input signals and provide the signals to core area 110 at a later time whenever required. Input buffers 120-1 through 120-N generally need to be implemented not to provide high load to the device (not shown) from which the input signal is received. In such a case, input buffers 120-1 through 120-N may be implemented as CMOS buffers which provide low load because of the high input impedance of CMOS devices.

Output buffers 140-1 through 140-M receive output signals on paths 114-1 through 114-M, store the output signals, and then provide the signals to other device(s) at a later time whenever required. Output buffers 140-1 through 140-M may need to be implemented to drive high load provided by the other device. In such a case, output buffers 140-1 through 140-M may be implemented as CMOS buffers.

The present invention enables both the input buffers and output buffers to be implemented using CMOS inverters while reducing the total power consumed. The manner in which the power consumption is reduced can be better appreciated by understanding some reasons why power may be unnecessarily consumed of some buffer circuits. Accordingly, the operation of general buffers is described below first.

2. Buffer

Figure 2A:
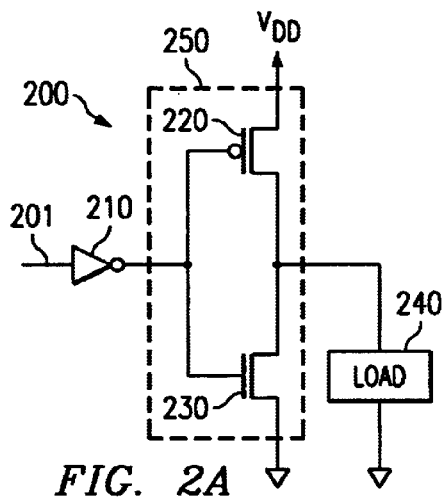
FIG. 2A is a circuit diagram illustrating the details of implementation of an embodiment of a buffer.
Figure 2B:
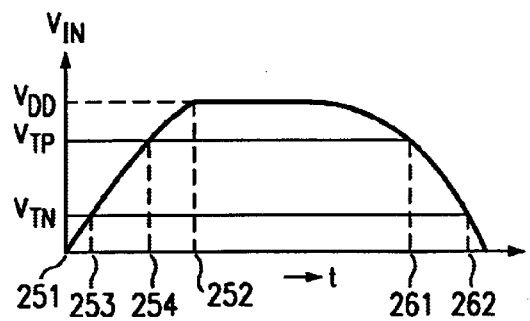
FIGS. 2B and 2C contain graphs together illustrating a typical reason for consumption of short circuit power in the embodiment of FIG. 2A.
Figure 2C:
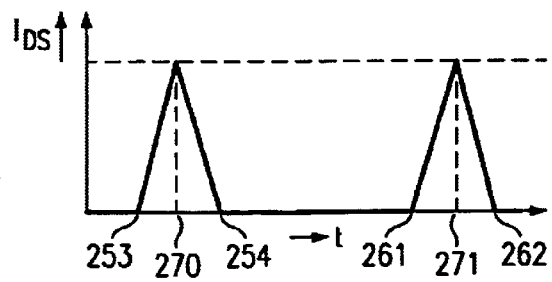

FIGS. 2A to 2C are diagrams together illustrating the details of operation of buffers and some reasons for consumption of unneeded power. FIG. 2A is a circuit diagram illustrating the details of CMOS buffer 200 in one embodiment. CMOS buffer 200 is shown containing inverter 210, CMOS inverter stage 250 and load 240. Each component is described below.

Inverter 210 receives input on path 201 and provides inverted input signal on gate terminals of NMOS transistor 230 and PMOS transistor 220. CMOS inverter stage 250 is formed by PMOS transistor 220 and NMOS transistor 230, and operates to invert the input signal received from inverter 210. Inverter 210 may also be implemented as a CMOS inverter stage. The same input received on path 201 is used to drive load 240 due to the two inversion operations. The manner in which unneeded power consumption may occur due to short circuit power dissipation is described below with reference to FIGS. 2B and 2C.

FIG. 2B is a graph depicting an input signal (provided on gate terminals of transistors 220 and 230) illustrating the reasons for the occurrence of short circuit power consumption in buffer 200. The input signal is shown rising approximately to $V_{DD}$ over a short duration between time points 251 and 252. In general, NMOS transistor 230 turns on responsive to voltage levels above $V_{TN}$ (threshold voltage, $V_T$, shown at time point 253) and PMOS transistor 220 turns on responsive voltage levels below $V_{TP}(V_{DD}-V_T)$ on their respective gate terminals.

Accordingly, for the input voltage level below $V_{TN}$, NMOS transistor 230 is off and PMOS transistor 220 is on.

Similarly for the input voltage level above $V_{TP}$, NMOS transistor 230 is on and PMOS transistor 220 is off. But, for the input voltage level between $V_{TN}$ and $V_{TP}$, both transistors 220 and 230 will be on, which creates short circuit (between Vdd and ground) in CMOS inverter stage 250. The short circuit draws current and thus causes short circuit power dissipation in CMOS buffer 200 as further illustrated by FIG. 2C.

FIG. 2C is a graph illustrating the details of the short circuit power dissipation in CMOS inverter stage 250. When the input signal transitions from one logical value to another, there exists a time duration (between time points 253 and 254) in which the voltage level is between $V_{TN}$ and $V_{TP}$. Short circuit power is similarly shown between time points 261 and 262. Accordingly, the short circuit current is shown in that duration, with a peak reached at time points 270 and 271. From the description, it may be appreciated that short circuit power dissipation may potentially occur at every transition of the input signal value.

Short circuit power dissipation is particularly problematic in several types of environments. For example, high current levels are often needed to drive high loads, and the short circuit power dissipation may also be correspondingly high when high loads are to be driven. In addition, the problem is exacerbated when the input signal operates at high frequencies since the number of times the power dissipates in a specific interval may also be proportionately high. At least in situations such as mobile applications (e.g., cell phones), such unneeded power dissipation may be undesirable.

Accordingly, it may be desirable to reduce the short circuit power consumption. An approach for reducing the short circuit power consumption is described below.

3. Split-path CMOS Buffer

Figure 3A:
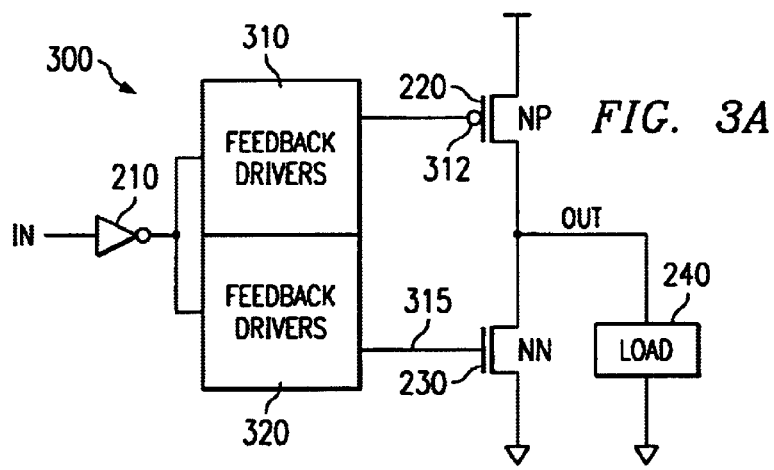
FIG. 3A is a block diagram illustrating the details of an embodiment of a buffer according to an aspect of the present invention.
Figure 3B:
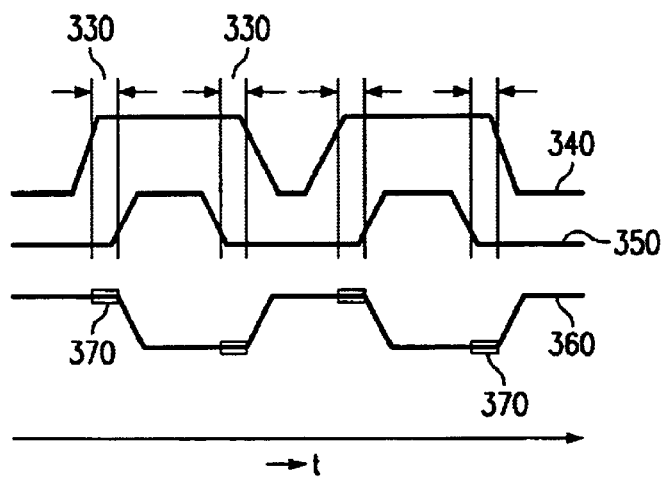
FIG. 3B is a timing diagram illustrating the manner in which short circuit power may be reduced/eliminated in an embodiment of the present invention.

FIGS. 3A and 3B are diagrams together illustrating the details of a split path CMOS buffer in an embodiment of the present invention. FIG. 3A is a block diagram illustrating the details of the split path CMOS buffer. CMOS buffer 300 is shown containing inverter 210, PMOS transistor 230, NMOS transistor 220, load 240 and feedback drivers 310 and 320. The operation of all components with the same labels may be similar to that of FIG. 2A except that of feedback drivers 310 and 320. The manner in which feed back drivers 310 and 320 operate to avoid both transistors 220 and 230 being in the on status is described below.

Feed back drivers 310 and 320 respectively split the path of input signal, and delay the input signal to at least one of the two gate terminals 312 and 315 (of transistors 220 and 230) to prevent the two transistors from being in the on state at the same time. In an embodiment, feed back drivers 310 and 320 cause gate terminal 312 to charge first and then gate terminal 315 may charge after some delay. Similarly, gate terminal 315 discharges first and then gate terminal 312 discharges after some delay.

The effect of such a delay is to cause PMOS transistor 220 and NMOS transistor 230 to be turned off for a small duration since the charge on terminal 312 may be above $V_{TP}$ and charge on terminal 315 may be below $V_{TN}$. Therefore, when both transistors 220 and 230 are turned off, a tri state status is present on the output signal provided to load 240. As a result, the two transistors 220 and 230 may not be in an ON state at the same time when input signal makes a transition. The description is continued with reference to a timing diagram illustrating the operation of the two feedback drivers in further detail.

FIG. 3B is a graph illustrating the details of input signals at gate terminals 312 and 315 and output signal at load 240. The input signal on gate terminals 312 and 315 respectively represented by lines 340 and 350 and output signal by line 360. It may be observed by from graphs 340 and 350 that input signal 350 is delayed by a time duration 330 with reference to the input signal 340 during both and rise of the input signal.

The short delay may cause transistors 220 and 230 to be turned off for a short duration as represented by thick portions on line 370. The short duration may be designed to fall within a time duration in which the voltage of the input signal is between the two threshold voltages $V_{TN}$, and $V_{TP}$. As a result, both transistors 220 and 230 may not be in an on state at the same time. Thus, short circuit power dissipation may be avoided (or reduced) by using the split path approach noted above.

According to an aspect of the present invention, the split path circuits are implemented without using common input inverter(s) in the feedback drivers. Such a feature again avoids (or reduces) unneeded short circuit power dissipation. The feature will be clearer by understanding the operation of an embodiment which uses common input inverter(s) in the feedback drivers. Accordingly, such an embodiment is described first below with reference to FIG. 4.

4. Feedback Drivers Using Common Input Inverter(s)

Figure 4:
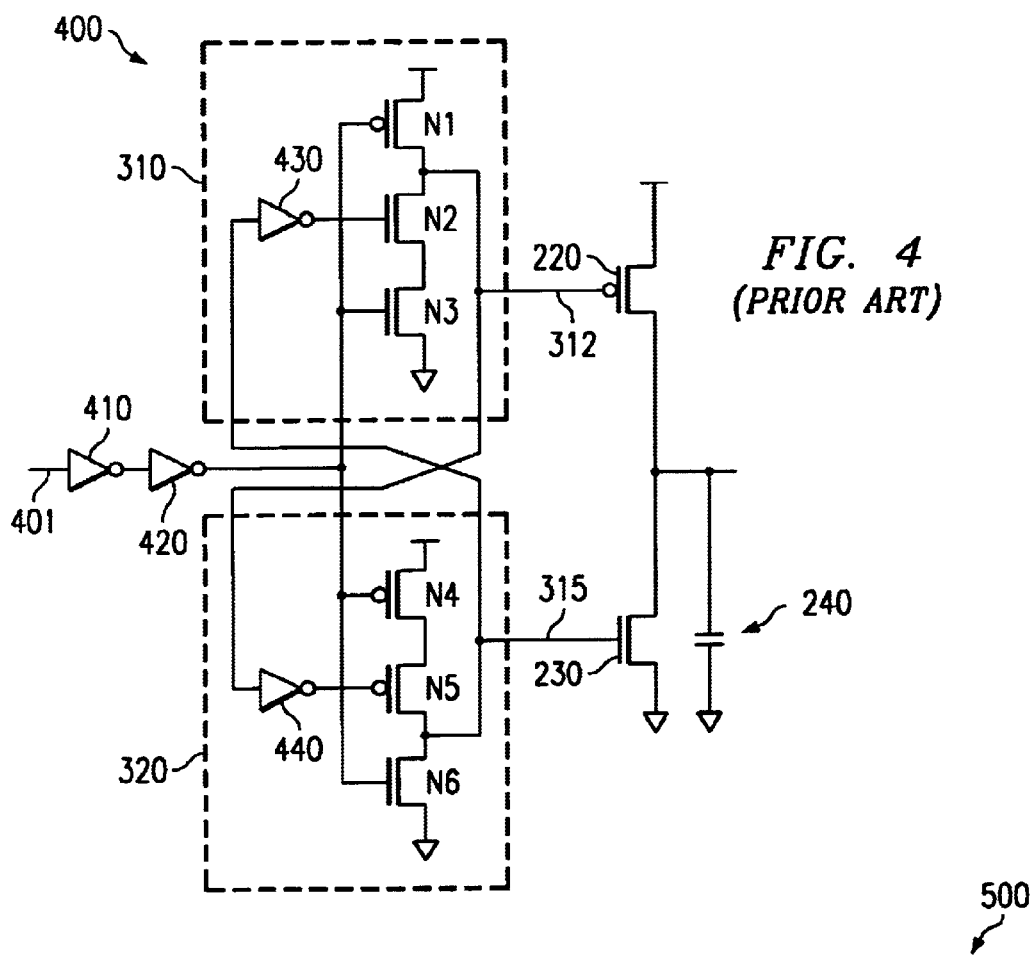
FIG. 4 is a circuit diagram illustrating the details of a CMOS buffer using a common input inverter in each feedback driver path.

FIG. 4 is a circuit diagram illustrating the details of CMOS buffer 400 using a common input inverter in each feedback driver path. CMOS buffer 400 is shown containing inverters 410, 420, 430 and 440, PMOS transistors N1, N4, N5 and NMOS transistors N2, N3 and N6. The operation of each component is described below.

Inverters 410 and 420 may provide the input signal to drive load 240. Transistors N1, N2, N3 and common input inverter 430 form a first feedback driver. Similarly, transistors N4, N5, N6 and common input inverter 440 form a second feedback driver. For illustration, it is now assumed that input signal on path 401 has been at high logical level, causing gate terminals 312 and 315 to be at a logical low level ("logic low"). The logic low on gate terminal 312 is fed back through common input inverter 440 which turns off transistor N5. Thus gate terminal 315 cannot charge until gate terminal 312 charges to logic high.

Now, assuming that input signal on path 401 transitions from a logical high level to a logical low level, transistors N1 and N4 turn on, and transistors N3 and N6 turn off. As a result, gate terminal 312 charges first to logic high and gate terminal 315 starts charging after terminal 312 is charged to logic high. Thus, charging of gate terminal 315 is delayed which may cause a delay in turn on of transistor 230.

Similarly, when input signal on path 401 makes a transition from a logical low to high, gate terminal 315 discharges first and then gate terminal 312 is discharged. Again, the delay in discharge of gate terminal 312 may cause delay in turn on of transistor 220. The delay in charging/discharging of gate terminals 312 and 315 may avoid transistors 220 and 230 being on at the same time and thus reduces the short circuit power dissipation.

One problem with CMOS buffer 400 is that short circuit power dissipation would continue to be caused by the common input inverters present in the feedback drivers. Thus, common input inverters 430 and 440, and the two three-transistor inverters (one three transistor inverter formed by transistors N1, N2 and N3 and other three transistor inverter formed by transistors N1, N1 and N6) may cause short circuit power dissipation due to reasons described with reference to FIGS. 2A–2C above.

Thus, an aspect of the present invention enables the feedback drivers to be implemented without using common input inverters as described below in further detail with reference to FIG. 5.

5. Feedback Drivers without Common Input Inverter(s)

Figure 5:
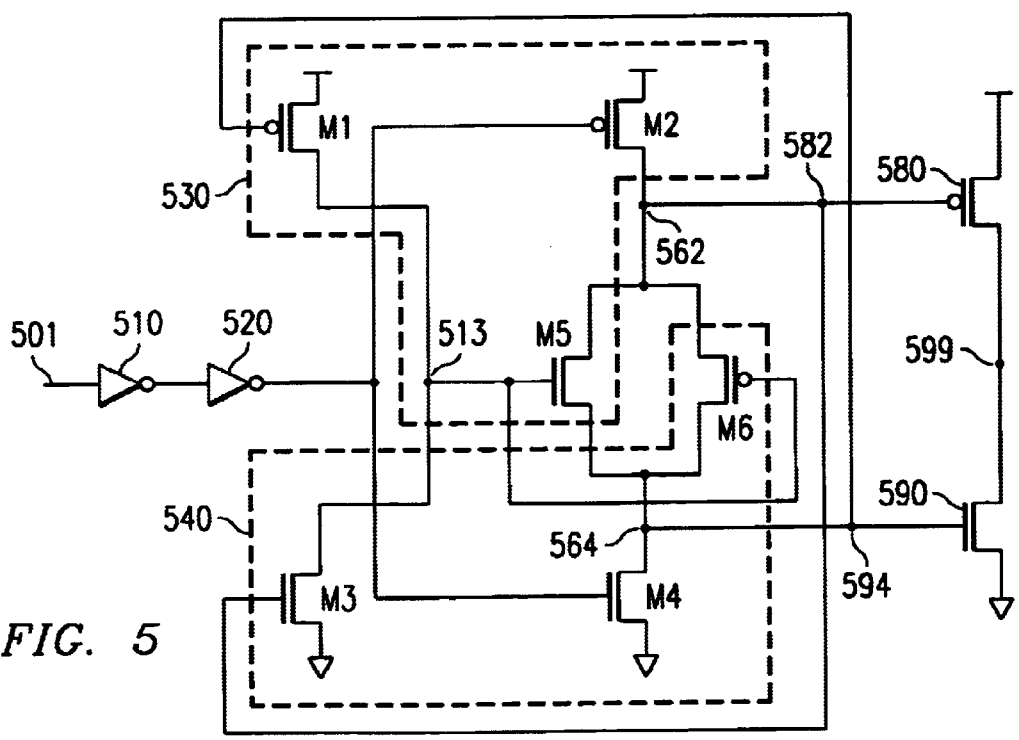
FIG. 5 is a circuit diagram illustrating the details of a CMOS buffer according to an aspect of the present invention.

FIG. 5 is a circuit diagram illustrating the details of CMOS buffer 500 according to an aspect of the present invention. Input buffers (120-1 through 120-N) and output buffers (140-1 through 140-M) of FIG. 1 may be implemented similar to CMOS buffer 500. CMOS buffer 500 is shown containing inverters 510 and 520, PMOS transistors (M1, M2, M6), NMOS transistors (M3, M4, M5), and transistors 580 and 590. Each component is described below.

Inverters 510 and 520 generate a delayed version of input signal received on path 501. The output of inverter 520 drives the gate terminal of transistors M2 and M4. The gate terminals (594 and 582) of transistors 590 and 580 are respectively connected to the gate terminals of transistors M1 and M3. The drain terminals of M1 and M3 are shown connected at node 513, which in turn is connected to the gate terminals of both transistors M5 and M6.

The source and drain terminals of M5 are respectively connected to the drain and source terminals of transistor M6 at the corresponding nodes 564 and 562. Nodes 562 and 564 are connected to the drain terminal of transistors M2 and M4 respectively. Nodes 562 and 564 are further connected to gate terminals 582 and 594 (of transistors 580 and 590) respectively.

The drain terminals of transistors 580 and 590 are shown connected at node 599, which may drive an external device/load (not shown). The source terminals of transistors M1, M2 and 580 are connected to supply $V_{dd}$ (not shown). The source terminals of M3, M4 and 590 are connected to ground.

From the above connections, it may be appreciated that transistors M1, M2 and M5 form feed back driver 530 to drive PMOS transistor 580, and transistors M3, M4, and M6 form feed back driver 540 to drive NMOS transistor 590. As may be appreciated, the two feedback drivers do not contain a pair of transistors which would form a common input inverter. As noted above, common input inverters may cause short circuit current, which is undesirable. The operation of the two feedback drivers is described below in further detail.

Feed back driver 530 provides a delay for discharging gate terminal 582 until gate terminal 594 discharges when the input signal changes from low (i.e., at a low logical level) to high (high logical level) as described below. For illustration, assuming that the input signal has been low for a reasonably long time, output on node 599 is also low as CMOS buffer 500 stores the input signal and provides the stored value on node 599. Gate terminals 582 and 594 would be at a high logical level.

The high logical value on gate terminal 582 is fed back to transistor M3 causing M3 to turn on. Similarly, the high logical value on gate terminal 594 is fed back to transistor M1 causing M1 to turn off. The off status of M1 continues until gate terminal 594 is discharged to the voltage level $V_{TP}$ of transistor M1.

Now, assuming that input on path 501 transitions from a logical low to high value, inverters (510 and 520) provide logical high value on the gate terminals of transistors M2 and M4. As a result, PMOS transistor M2 turns off and NMOS transistor M4 turns on, which causes gate terminal 594 to discharge through M4.

Thus, it may be appreciated that gate terminal 594 starts discharging immediately after a low to high transition at input 501. On the other hand, gate terminal 582 does not start discharging until transistor M1 turns on because M5 turns on only after M1 turns on. M6 may be chosen to be of small size to delay the discharge of node 582. After some delay determined by feed back driver 530, gate terminal 594 discharges to the voltage level $V_{TP}$. which causes transistor M1 to turn on. Transistor M1 starts charging the gate terminals of transistors M5 and M6 and thus causing M5 to turn on and M6 to turn off. Hence, gate terminal 582 starts discharging through transistors M5 and M4.

Accordingly, discharging of gate terminals 582 and 594 causes transistor 590 to be turned off and transistor 580 to be turned on, and thus providing a high on node 599 to charge a load (not shown). Thus, the high input signal on path 501 is stored and provided on node 599 without short circuit power dissipation due to the delay provided by feed back driver 530.

Similarly, feed back driver 540 (M3, M4, and M6) provides delay for charging gate terminal 594 until gate terminal 582 charges when the input signal changes from high logical value to low logical value. When the input signal on path 501 was at a high logical value, gate terminals 582 and 594 were at a low logical value. The logical low on gate terminal 594 is fed back to transistor M1, causing M1 to turn on. Similarly, the logical low on gate terminal 582 is fed back to transistor M3 causing M3 to turn off until gate terminal 582 is charged to the voltage level $V_{TN}$. Thus, gate terminal 594 may not charge until transistor M3 turns on.

Now, assuming that input on path 501 transitions from high to low logical value, transistor M4 turns off and transistor M2 turns on, causing gate terminal 582 to charge through M2. After some delay determined by feed back driver 540, gate terminal 594 may be charged to the voltage level $V_{TN}$ which causes transistor M3 to turn on. Transistor M3 in turn turns off M5 and turns on M6, which causes gate terminal 594 to charge through transistors M6 and M2. M5 may be implemented of small size to delay the charging of node 594.

Thus, gate terminal 594 starts charging only after gate terminal 582 has charged up to a voltage level of $V_{TN}$. As a result, transistor 590 turns on only after transistor 580 turns off when the input changes from a high logical value to a low logical value on input 501. Once the two transistors have reached the respective steady state, a low logical value is provided on node 599.

Thus an aspect of the present invention reduces/avoids short circuit power dissipation. In addition, as neither feedback driver contains a common input CMOS inverter, the short circuit power dissipation may be further avoided or reduced. However, it may be observed that both transistors M1 and M3 (forming a split path inverter) are turned on for a short duration while charging/discharging of terminals 582 and 594, which may cause short circuit power dissipation. Such short circuit power dissipation may be minimized by using small sized transistors M1 and M3.

Thus, the short circuit power dissipation due to turn on of transistors 580 and 590 at the same time may be reduced. It may be readily appreciated from FIG. 5 that CMOS buffer 500 have only one split path inverter stage (formed by transistors M1 and M3) in feed back drivers 530 and 540 and the short circuit power dissipation due to the split path inverter stage may be negligible.

In addition, only 6 transistors are shown required for feed back drivers 530 and 540, which may further reduce total power consumption and also the required area compared to that of FIG. 4 (which has 10 transistors).

6. Conclusion

While various embodiments of the present invention have been described above, it should be understood that they have been presented by way of example only, and not limitation.

Thus, the breadth and scope of the present invention should not be limited by any of the above described exemplary embodiments, but should be defined only in accordance with the following claims and their equivalents.

What is claimed is:

1. A CMOS inverter comprising:
   a first PMOS transistor containing a source terminal, a drain terminal and a gate terminal;
   a first NMOS transistor containing a source terminal, a drain terminal and a gate terminal, wherein the drain terminal of said first PMOS transistor is coupled to the drain terminal of said first NMOS transistor;
   a first feedback driver implemented without a common input CMOS inverter, said first feedback driver receiving an input signal containing a transition from one logical value to another, said first feedback driver being coupled to said gate terminal of said first PMOS transistor; and
   a second feedback driver implemented without a common input CMOS inverter, said second feedback driver also receiving said input signal, said second feedback driver being coupled to said gate terminal of said first NMOS transistor,
   wherein said first feedback driver and said second feedback driver together operate to delay a change from an off state to an on state of one of said first PMOS transistor and said first NMOS transistor in relation to a change from an on state to an off state of the other one of said first PMOS transistor and said first NMOS transistor;
   wherein said transition comprises a logical low to a logical high, wherein said first feedback driver comprises a second PMOS transistor, wherein said second PMOS transistor also contains a source terminal, a drain terminal and a gate terminal, wherein the gate terminal of said first NMOS transistor is coupled to the gate terminal of said second PMOS transistor such that said second PMOS transistor turns on after the gate terminal of said first NMOS transistor discharges to a threshold voltage level of said second PMOS transistor, wherein the turn on of said second PMOS transistor causes the drain terminal of said first PMOS transistor to start charging;
   wherein said transition comprises a logical high to a logical low, wherein said second feedback driver comprises a second NMOS transistor, wherein said second NMOS transistor also contains a source terminal, a drain terminal and a gate terminal, wherein the gate terminal of said first PMOS transistor is coupled to the gate terminal of said second NMOS transistor such that said second NMOS transistor turns on after the gate terminal of said first PMOS transistor charges to a threshold voltage level of said second NMOS transistor, wherein the turn on of said second NMOS transistor causes the drain terminal of said first NMOS transistor to start discharging;
   wherein said first feedback driver comprises a third PMOS transistor and said second feedback driver comprises a third NMOS transistor, each of said third PMOS transistor and said third NMOS transistor containing a source terminal, a drain terminal and a gate terminal, wherein said input signal is provided on the gate terminals of said third PMOS transistor and said third NMOS transistor, and wherein the drain terminal of said third PMOS transistor is coupled to the gate terminal of said first PMOS transistor, and wherein the drain terminal of said third NMOS transistor is coupled to the gate terminal of said first NMOS transistor.

2. The CMOS inverter of claim 1, wherein said first feedback driver comprises a fourth NMOS transistor and said second feedback driver comprises a fourth PMOS transistor, each of said fourth PMOS transistor and said fourth NMOS transistor containing a source terminal, a drain terminal and a gate terminal, wherein the gate terminal of said fourth NMOS transistor is coupled to the drain terminal of both said second PMOS transistor and said second NMOS transistor, wherein the gate terminal of said fourth PMOS transistor is also coupled to the drain terminal of both said second PMOS transistor and said second NMOS transistor, wherein the drain terminals of said fourth PMOS transistor and said fourth NMOS transistor are coupled to the gate terminal of said first PMOS transistor, and wherein the source terminals of said fourth PMOS transistor and said fourth NMOS transistor are coupled to the gate terminal of said first NMOS transistor.

3. The CMOS inverter of claim 2, wherein the source terminals of said first PMOS transistor, said second PMOS transistor and said third PMOS transistor are coupled to a supply voltage, and wherein the source terminals of said first NMOS transistor, said second NMOS transistor and said third NMOS transistor are coupled to a ground.

4. The invention of claim 3, wherein said CMOS inverter circuit is comprised in a buffer.

5. An integrated circuit comprising:
   a core area circuit; and
   a buffer coupled to said core area circuit, said buffer comprising an inverter, said inverter in turn comprising:
   a first PMOS transistor containing a source terminal, a drain terminal and a gate terminal;
   a first NMOS transistor containing a source terminal, a drain terminal and a gate terminal, wherein the drain terminal of said first PMOS transistor is coupled to the drain terminal of said first NMOS transistor at an output node;
   a first feedback driver implemented without a common input CMOS inverter, said first feedback driver receiving an input signal containing a transition from one logical value to another, said first feedback driver being coupled to said gate terminal of said first PMOS transistor; and
   a second feedback driver implemented without a common input CMOS inverter, said second feedback driver also receiving said input signal, said second feedback driver being coupled to said gate terminal of said first NMOS transistor,
   wherein said first feedback driver and said second feedback driver together operate to delay a change from an off state to an on state of one of said first PMOS transistor and said first NMOS transistor in relation to a change from an on state to an off state of the other one of said first PMOS transistor and said first NMOS transistor;
   wherein said transition comprises a logical low to a logical high, wherein said first feedback driver comprises a second PMOS transistor, wherein said second PMOS transistor also contains a source terminal, a drain terminal and a gate terminal, wherein the gate terminal of said first NMOS transistor is coupled to the gate terminal of said second PMOS transistor such that said second PMOS transistor turns on after the gate terminal of said first NMOS transistor discharges to a threshold voltage level of said second PMOS transistor, wherein the turn on of said second PMOS transistor causes the drain terminal of said first PMOS transistor to start charging;

wherein said transition comprises a logical high to a logical low, wherein said second feedback driver comprises a second NMOS transistor, wherein said second NMOS transistor also contains a source terminal, a drain terminal and a gate terminal, wherein the gate terminal of said first PMOS transistor is coupled to the gate terminal of said second NMOS transistor such that said second NMOS transistor turns on after the gate terminal of said first PMOS transistor charges to a threshold voltage level of said second NMOS transistor, wherein the turn on of said second NMOS transistor causes the drain terminal of said first NMOS transistor to start discharging;

wherein said first feedback driver comprises a third PMOS transistor and said second feedback driver comprises a third NMOS transistor, each of said third PMOS transistor and said third NMOS transistor containing a source terminal, a drain terminal and a gate terminal, wherein said input signal is provided on the gate terminals of said third PMOS transistor and said third NMOS transistor, and wherein the drain terminal of said third PMOS transistor is coupled to the gate terminal of said first PMOS transistor, and wherein the drain terminal of said third NMOS transistor is coupled to the gate terminal of said first NMOS transistor.

6. The integrated circuit of claim 5, wherein said first feedback driver comprises a fourth NMOS transistor and said second feedback driver comprises a fourth PMOS transistor, each of said fourth PMOS transistor and said fourth NMOS transistor containing a source terminal, a drain terminal and a gate terminal, wherein the gate terminal of said fourth NMOS transistor is coupled to the drain terminal of both said second PMOS transistor and said second NMOS transistor, wherein the gate terminal of said fourth PMOS transistor is also coupled to the drain terminal of both said second PMOS transistor and said second NMOS transistor, wherein the drain terminals of said fourth PMOS transistor and said fourth NMOS transistor are coupled to the gate terminal of said first PMOS transistor, and wherein the source terminals of said fourth PMOS transistor and said fourth NMOS transistor are coupled to the gate terminal of said first NMOS transistor.

7. The integrated circuit of claim 6, wherein the source terminals of said first PMOS transistor, said second PMOS transistor and said third PMOS transistor are coupled to a supply voltage, and wherein the source terminals of said first NMOS transistor, said second NMOS transistor and said third NMOS transistor are coupled to a ground.

* * * * *